(12) United States Patent
Fang et al.

(10) Patent No.: US 12,057,467 B2
(45) Date of Patent: Aug. 6, 2024

(54) IMAGE SENSOR DEVICE AND METHODS OF FORMING THE SAME

(71) Applicant: Taiwan Semiconductor Manufacturing Company, Ltd., Hsinchu (TW)

(72) Inventors: Yeh-Hsun Fang, Taipei (TW); Chiao-Chi Wang, Hsiang (TW); Chung-Chuan Tseng, Hsinchu (TW); Chia-Ping Lai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/365,680

(22) Filed: Aug. 4, 2023

(65) Prior Publication Data

US 2023/0378234 A1    Nov. 23, 2023

Related U.S. Application Data

(60) Division of application No. 18/070,239, filed on Nov. 28, 2022, now Pat. No. 11,894,411, and a continuation of application No. 16/901,931, filed on Jun. 15, 2020, now Pat. No. 11,515,355.

(51) Int. Cl.
*H01L 27/00* (2006.01)
*H01L 27/146* (2006.01)

(52) U.S. Cl.
CPC .. *H01L 27/14694* (2013.01); *H01L 27/14603* (2013.01); *H01L 27/14636* (2013.01); *H01L 27/1464* (2013.01)

(58) Field of Classification Search
CPC ......... H01L 27/14601; H01L 27/14603; H01L 27/14636; H01L 27/1464; H01L 27/14683; H01L 27/14694
See application file for complete search history.

(56) References Cited

U.S. PATENT DOCUMENTS

| | | |
|---|---|---|
| 2007/0034965 A1 | 2/2007 | Jung et al. |
| 2007/0099315 A1 | 5/2007 | Maa et al. |
| 2010/0006961 A1 | 1/2010 | Yasaitis et al. |
| 2013/0249039 A1 | 9/2013 | Hsu et al. |
| 2016/0064435 A1 | 3/2016 | Yabuki |
| 2016/0126272 A1 | 5/2016 | Kim |
| 2018/0069049 A1 | 3/2018 | Boettiger et al. |
| 2018/0269251 A1 | 9/2018 | Chang et al. |
| 2018/0351017 A1 | 12/2018 | Schneider et al. |
| 2019/0140133 A1 | 5/2019 | Chen et al. |

FOREIGN PATENT DOCUMENTS

| | | |
|---|---|---|
| CN | 1992323 | 7/2007 |
| CN | 106611765 | 5/2017 |
| CN | 111129044 | 5/2020 |
| TW | 201248837 | 12/2012 |

*Primary Examiner* — Reema Patel
(74) *Attorney, Agent, or Firm* — FOLEY & LARDNER LLP

(57) ABSTRACT

A method includes forming a plurality of openings extending into a substrate from a front surface of the substrate. The substrate includes a first semiconductor material. Each of the plurality of openings has a curve-based bottom surface. The method includes filling the plurality of openings with a second semiconductor material. The second semiconductor material is different from the first semiconductor material. The method includes forming a plurality of pixels that are configured to sense light in the plurality of openings, respectively, using the second semiconductor material.

18 Claims, 13 Drawing Sheets

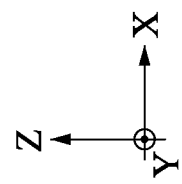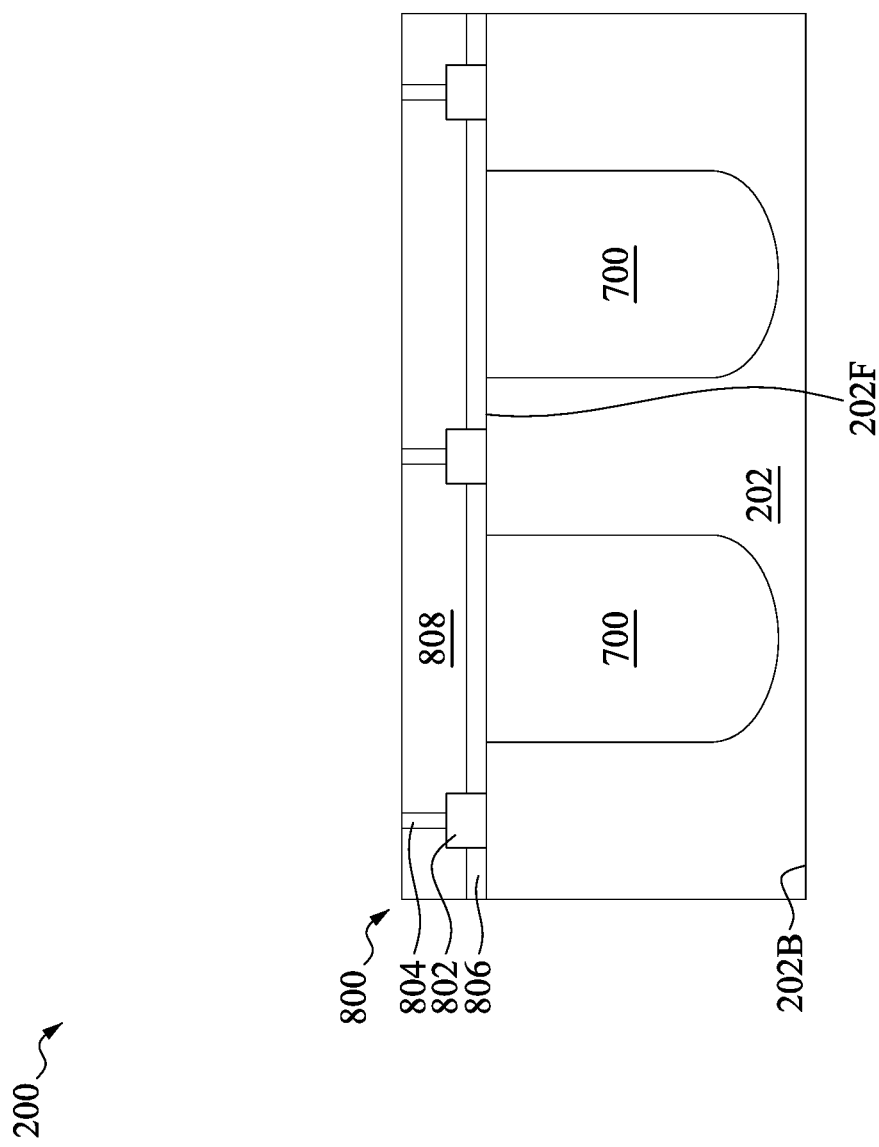
Fig. 8

IMAGE SENSOR DEVICE AND METHODS OF FORMING THE SAME

CROSS-REFERENCE TO RELATED APPLICATION

This application is a divisional of U.S. patent application Ser. No. 18/070,239, filed Nov. 28, 2022, and titled "IMAGE SENSOR DEVICE AND METHODS OF FORMING THE SAME," which is a continuation of U.S. patent application Ser. No. 16/901,931, filed Jun. 15, 2020, and titled "IMAGE SENSOR DEVICE AND METHODS OF FORMING THE SAME," the entire contents of which are incorporated herein by reference for all purposes.

BACKGROUND

The present disclosure generally relates to image sensor devices, and particularly to image sensor devices including at least two different semiconductor materials and methods of forming the same.

There is a constant drive within the semiconductor industry to increase the performance and reduce the cost of semiconductor devices, such as photodetectors, diodes, light-emitting diodes, transistors, latches, and many other semiconductor devices. This drive has resulted in continual demands for integrating one type of semiconductor devices into another semiconductor process.

For example, in an array of photodetectors, it is advantages to make respective p-n junctions and/or p-i-n structures of the photodetectors using non-silicon semiconductor materials that typically have a low band-gap (e.g., germanium (Ge) or other III-V semiconductor materials). In the interest of cost-efficiency, it is desired to integrate such non-silicon materials into low-cost large-size silicon wafers to reduce the cost of high performance non-silicon devices. By integrating non-silicon p-n junctions and/or p-i-n structures into a silicon process, other circuitry in a system (e.g., an image sensor device) can be fabricated using a standard complementary-metal-oxide-semiconductor (CMOS) process. Moreover, when fabricating the non-silicon devices and silicon CMOS in a co-planar manner, the interconnection and integration of the whole system can be conducted in a manner compatible with standard and low-cost CMOS process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, 9, 10, and 11 illustrate cross-sectional views of an example image sensor device during various fabrication stages, made by the method of FIG. 1, in accordance with some embodiments.

DETAILED DESCRIPTION

Figure 1:
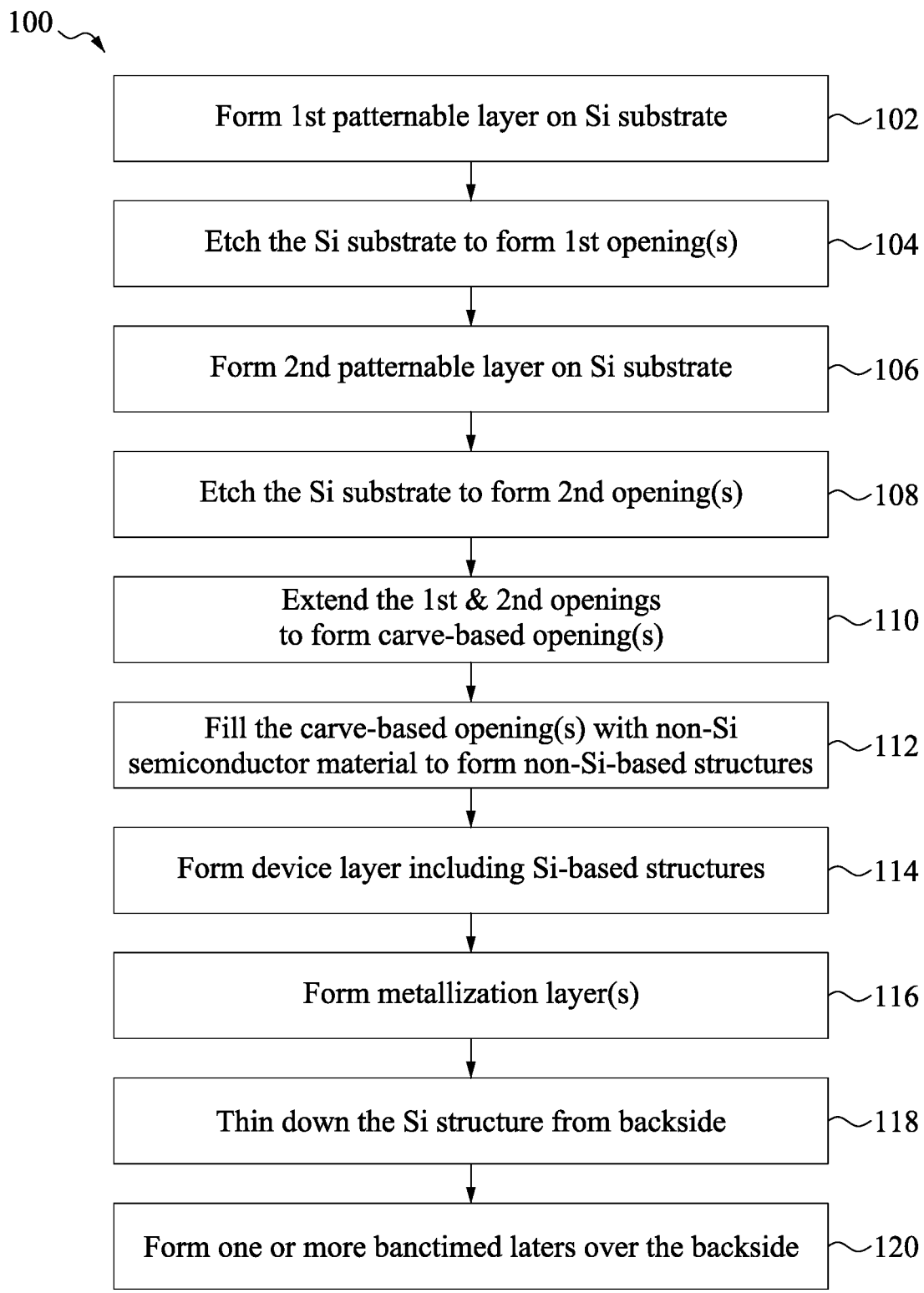
FIG. 1 illustrates a flow chart of an example method for making an image sensor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about" and "substantially" can indicate a value of a given quantity that varies within 5% of the value (e.g., ±1%, ±2%, ±3%, ±4%, ±5% of the value).

Although performance of a semiconductor device can be significantly improved by integrating non-silicon semiconductor materials (and corresponding structures/components) into silicon wafers, utility of the semiconductor device fabricated using a combination of such "dissimilar" semiconductor materials (frequently known as a "heterostructure"), however, depends on the quality of the resulting structure. For example, a low level of dislocation defects is generally desired in a wide variety of semiconductor devices and processes, because dislocation defects partition an otherwise monolithic crystal structure and introduce unwanted and abrupt changes in electrical and optical properties, which, in turn, results in limited or if not poor performance. In addition, such dislocation detects can degrade physical properties of the device material and can lead to premature device failure.

These dislocation defects typically arise in efforts to epitaxially grow one kind of crystalline material on a substrate of a different kind of material (the heterostructure), due to different crystalline lattice sizes of the two materials. This lattice mismatch between the starting substrate and subsequent layer(s) creates stress during material deposition that generates dislocation defects in the semiconductor substrate and/or layer(s).

In general, misfit dislocations form at the mismatched interface to relieve the misfit strain. Many misfit dislocations have vertical components, referred to as "threading segments," which terminate at the surface. These threading segments continue through all semiconductor layers subsequently added to the heterostructure. In addition, threading dislocation defects can arise in the epitaxial growth of the same material as the underlying substrate where the substrate itself contains dislocations. Some of the dislocations replicate as threading dislocation defects in the epitaxially grown material. Other kinds of dislocation defects include stacking faults, twin boundaries, and anti-phase boundaries. Such dislocations in the active regions of a semiconductor device, such as an image sensor device, may significantly degrade its performance.

The present disclosure provides various embodiments of a semiconductor device, including a non-silicon semiconductor material integrated into a silicon substrate, and methods for forming the same. For example, the semiconductor device may be an image sensor device (e.g., a time-of-flight (ToF) sensor, an infrared sensor, etc.) that includes one or more regions or structures (e.g., pixels) formed in a silicon substrate, each of which includes a non-silicon semiconductor material. In various embodiments, the non-silicon semiconductor material may be epitaxially grown over one or more recesses (or openings) formed in a silicon substrate to form the one or more regions. By modifying a profile or surface of the recess prior to growing the non-silicon semiconductor material, an amount of the threading dislocation defects (e.g., threading dislocation density (TDD)) in the epitaxially grown non-silicon semiconductor materials (or layers) can be significantly decreased.

For example, the profile of a recess may be modified to present a curve-based bottom surface. As such, the dislocation defects, if any, can be aggregated (or otherwise constrained) at the bottom portion of a later formed non-silicon semiconductor layer. In another example, the bottom surface of a recess may be modified to include a number of protruded patterns, which can also help the dislocation defects to be aggregated at the bottom portion. In yet another example, the sidewalls of a recess may be each covered by a doped dielectric layer, which can also help the dislocation defects to be aggregated at the bottom portion. In certain configurations/applications of the semiconductor device, the bottom portion of the semiconductor layer where the dislocation defects are aggregated may be removed in one of the following processes to make the semiconductor device. As such, the portion where the active regions are formed (e.g., an upper portion of the semiconductor layer) can have significantly reduced dislocation defects, which can in turn minimize any negative impact to the performance of the semiconductor device that is due to the dislocation defects.

FIG. 1 illustrates a flowchart of a method 100 to form an image sensor device, according to one or more embodiments of the present disclosure. It is noted that the method 100 is merely an example, and is not intended to limit the present disclosure. Accordingly, it is understood that additional operations may be provided before, during, and after the method 100 of FIG. 1, and that some other operations may only be briefly described herein. In some embodiments, operations of the method 100 may be associated with cross-sectional views of an image sensor device at various fabrication stages as shown in FIGS. 2, 3, 4, 5, 6, 7, 8, 9, 10, and 11, respectively, which will be discussed in further detail below.

In brief overview, the method 100 starts with operation 102 of forming a first patternable layer on a silicon substrate. The method 100 continues to operation 104 of etching the silicon substrate to form one or more first openings. The method 100 continues to operation 106 of forming a second patternable layer on the silicon substrate. The method 100 continues to operation 108 of etching the silicon substrate to form one or more second openings. The method 100 continues to operation 110 of extending the first opening(s) and the second opening(s) to form a number of curve-based openings. The method 100 continues to operation 112 of filling the curve-based openings with a non-silicon semiconductor material to form a number of non-silicon-based structures. The method 100 continues to operation 114 of forming one or more silicon-based structures. The method 100 continues to operation 116 of forming one or more metallization layers. The method 100 continues to operation 118 of thinning down the silicon substrate from its backside. The method 100 continues to operation 120 of forming one or more functional layers over the backside of the silicon substrate.

As mentioned above, FIGS. 2-11 each illustrates, in a cross-sectional view, a portion of an image sensor device 200 at various fabrication stages of the method 100 of FIG. 1. FIGS. 2-11 are simplified for a better understanding of the concepts of the present disclosure. Although the figures illustrate image sensor device 200, it is understood the image sensor device 200 may comprise a number of other devices such as pad structures, resistors, inductors, fuses, capacitors, coils, etc., which are not shown in FIGS. 2-11, for purposes of clarity of illustration.

Generally, a BSI image sensor device includes a semiconductor substrate (e.g., a silicon substrate) with pixels or radiation-sensing regions formed therein. As disclosed herein, the terms "radiation-sensing regions" and "pixels" may be used interchangeably. A BSI image sensor device can include a pixel array arranged within the semiconductor substrate. The pixel array is vertically arranged with respect to a multilevel metallization layer (e.g., one or more interconnect structures) formed on a first surface of the semiconductor substrate. The first surface of the semiconductor substrate is herein referred to as a frontside or a front surface of the semiconductor substrate. The pixel array extends into the semiconductor substrate and is configured to receive radiation through a second surface of the semiconductor substrate opposite to the front surface of the semiconductor substrate. This second surface of the semiconductor substrate that receives the radiation (and is opposite to the front surface of the semiconductor substrate) is herein referred to as a backside or a back surface of the semiconductor substrate. In the following discussions, the image sensor device 200 may be presented as a BSI image sensor device. However, it should be understood that at least some of the operations of the method 100 (e.g., operations 102, 104, 106, 108, 110, 112, 114, 116) may be used to fabricate a front side illuminated (FSI) image sensor device, operable to detect radiation from its frontside, while remaining within the scope of the present disclosure.

Figure 2:
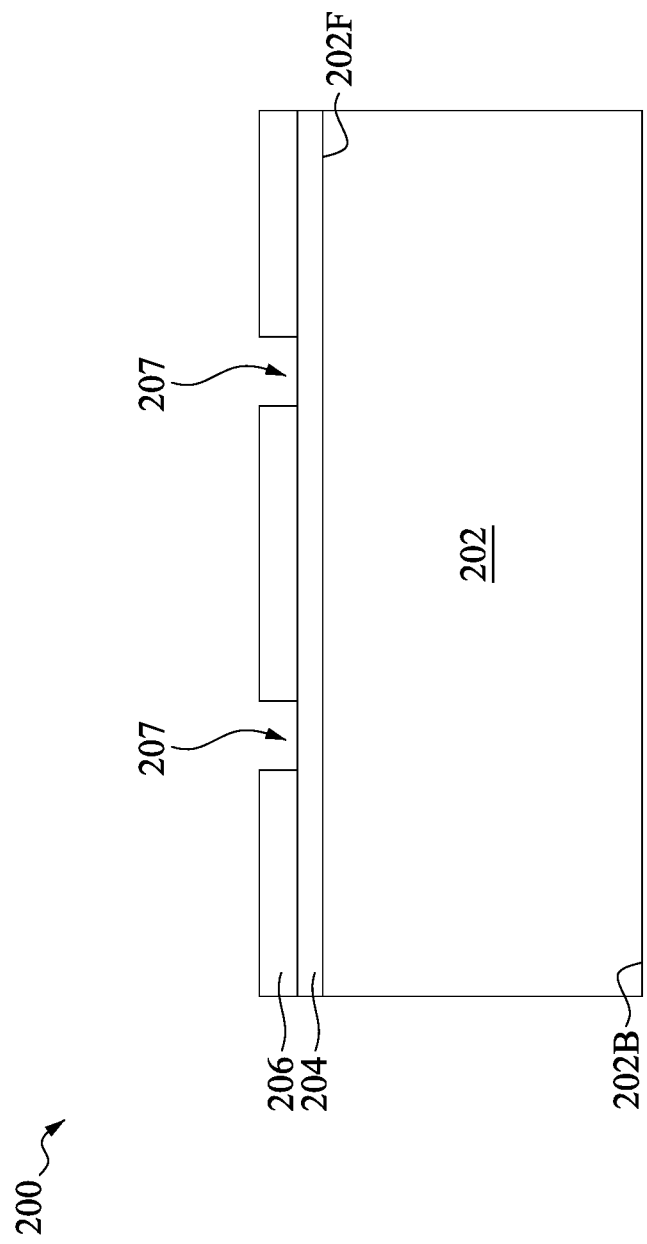

Corresponding to operation 102 of FIG. 1, FIG. 2 is a cross-sectional view of the image sensor device 200 including a silicon substrate (or silicon layer) 202 overlaid by a dielectric layer 204 and a first patternable layer 206 at one of the various stages of fabrication. The dielectric layer 204 and the first patternable layer 206 are formed over a front surface 202F of the silicon substrate 202. Opposite to the front surface 202F (e.g., along the Z axis), the silicon substrate 202 has a back surface 202B, through which the image sensor device 200 is configured to receive incident radiation.

The silicon substrate 202 can include a bulk silicon wafer or a top layer of a silicon on insulator wafer (SOI). Further, the silicon substrate 202 can be an epitaxial material strained for performance enhancement and/or a doped with n-type dopants, p-type dopants, or combinations thereof. In various embodiments, the silicon substrate 202 can include combinations of p-type and n-type doped regions. The dielectric layer 204 can include any suitable materials such as, for example, an oxide or nitride of a semiconductor element (e.g., $SiO_x$ or $SiN_x$). Other materials are also applicable, such as an oxide or nitride of a metal element, a metal alloy, or a ceramic material. The first patternable layer 206, which includes a lithography layer (e.g., a photoresist (PR) layer), can include one or more patterns (e.g., openings or windows) 207. Such a pattern can be used to define the location of a first opening extending from the front surface 202F into the silicon substrate 202, which shall be discussed below.

Figure 3:
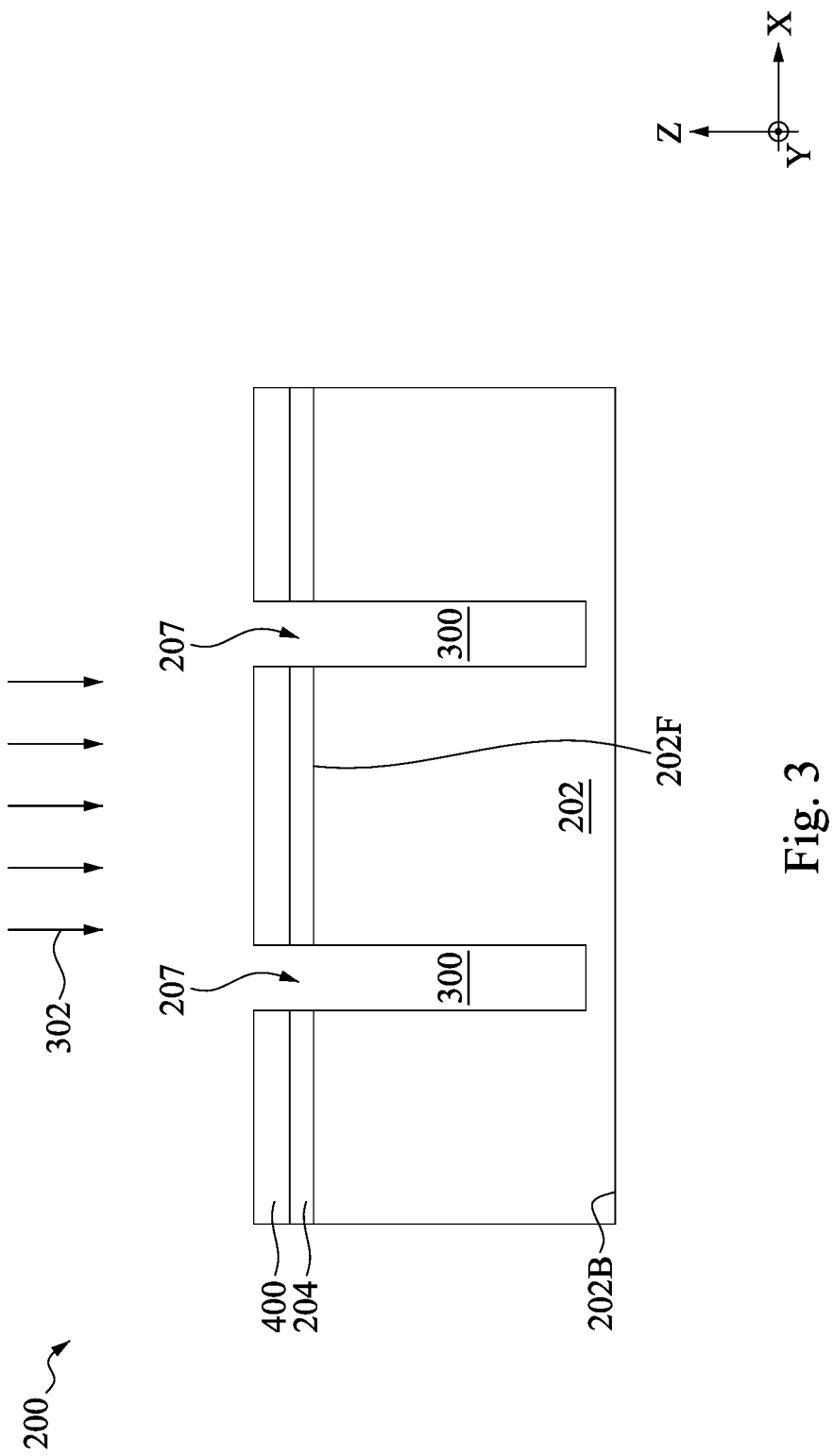

Corresponding to operation 104 of FIG. 1, FIG. 3 is a cross-sectional view of the image sensor device 200 including one or more first openings (or first sub-openings) 300 extending into the silicon substrate 202 at one of the various stages of fabrication. The first openings 300 can extend into the silicon substrate 202 from the front surface 202F. In some embodiments, the first openings 300 may be formed by performing an anisotropic etching process 302 (indicated by arrows in FIG. 3) on the dielectric layer 206 and the silicon substrate 202, with the first patternable layer 206 functioning as a mask. The anisotropic etching process 302 may include one or more dry etching processes such as, for example, a reactive ion etching (ME) process, an ion beam etching (IBE) process, or combinations thereof. For example, according to the patterns 207, one or more portions of the dielectric layer 206 may be etched by a first dry etching process using tetrafluoromethane ($CF_4$) gas, and one or more corresponding portions of the silicon substrate 202 (e.g., the portions exposed by the etched portions of the dielectric layer 206) may be etched by a second dry etching process using a gas mixture of chlorine ($Cl_2$) and HBr to form the first openings 300.

Figure 4:
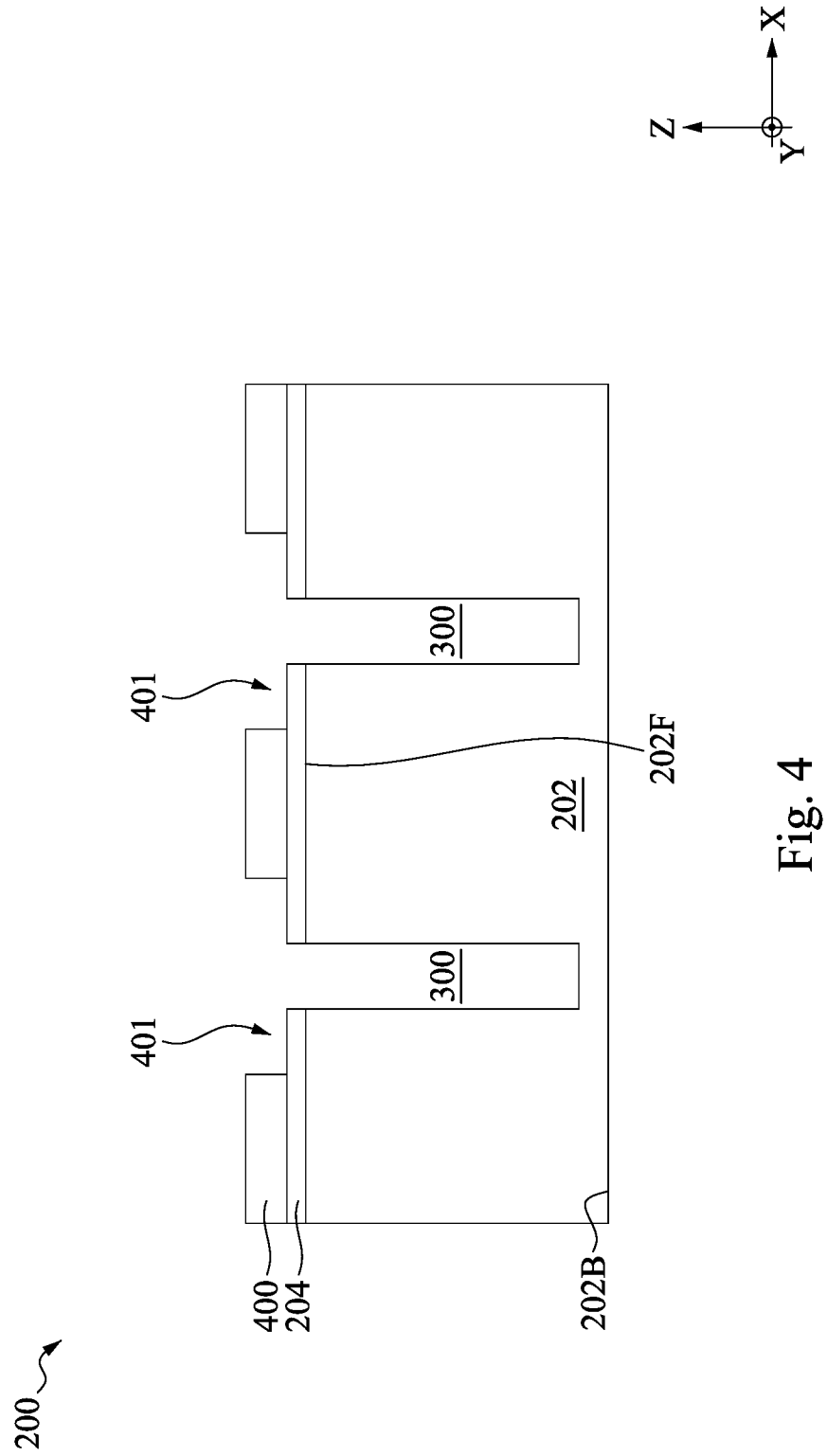

Corresponding to operation 106 of FIG. 1, FIG. 4 is a cross-sectional view of the image sensor device 200 including a second patternable layer 400 overlaying the silicon substrate 202 at one of the various stages of fabrication. The second patternable layer 400, which includes a lithography layer (e.g., a photoresist (PR) layer), can include one or more patterns (e.g., openings or windows) 401. Such a pattern can be used to define the location of a second opening extending from the front surface 202F into the silicon substrate 202, which shall be discussed below. In some embodiments, the second pattern 401 may have a width (along the X axis) greater than a width of the first opening 300. Further, each of the second openings 401 may be vertically (along the Z axis) aligned with one of the first openings 300, as shown in FIG. 4.

Figure 5:
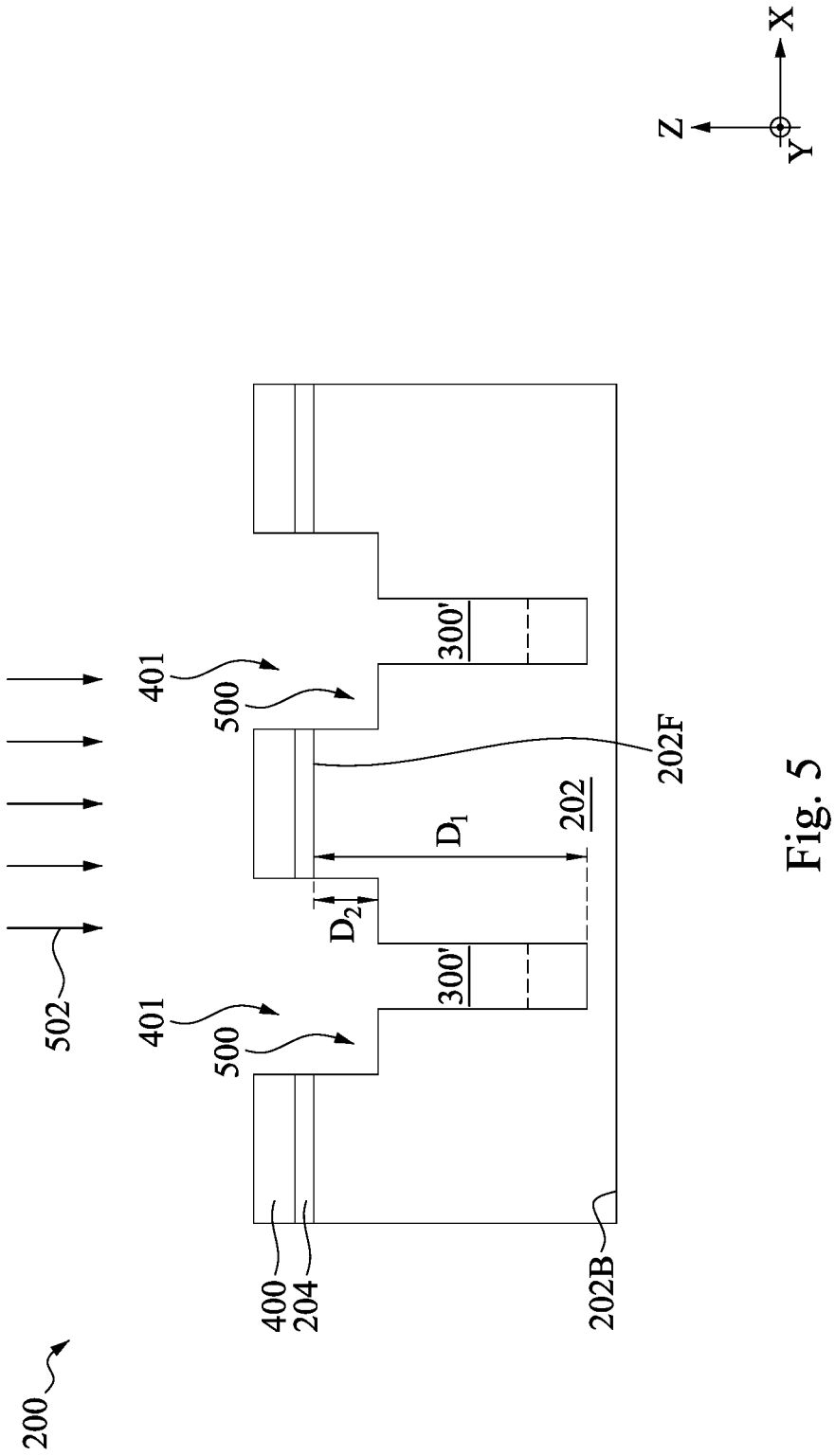

Corresponding to operation 108 of FIG. 1, FIG. 5 is a cross-sectional view of the image sensor device 200 including one or more second openings (or second sub-openings) 500 extending into the silicon substrate 202 at one of the various stages of fabrication. The second openings 500 can extend into the silicon substrate 202 from the front surface 202F. In some embodiments, the second openings 500 may be formed by performing an anisotropic etching process 502 (indicated by arrows in FIG. 5) on the dielectric layer 206 and the silicon substrate 202, with the second patternable layer 204 functioning as a mask. The anisotropic etching process 502 may include one or more dry etching processes such as, for example, a reactive ion etching (ME) process, an ion beam etching (IBE) process, or combinations thereof. For example, according to the patterns 401, one or more portions of the dielectric layer 206 may be etched by a first dry etching process using tetrafluoromethane ($CF_4$) gas, and one or more corresponding portions of the silicon substrate 202 (e.g., the portions exposed by the etched portions of the dielectric layer 206) may be etched by a second dry etching process using a gas mixture of chlorine ($Cl_2$) and HBr to form the second openings 500.

As mentioned above with respect to FIG. 4, each of the patterns 401 has a wider width than a first opening 300 overlaid by the corresponding pattern 401. As such, when performing the anisotropic etching process 502, an upper portion of the first opening 300 may be enlarged (or otherwise widened along the X axis) forming the second opening 500, and a lower portion of the first opening 300 may be further extended into the silicon substrate 202 to form first opening 300', as illustrated in FIG. 5. In some embodiments, the first opening 300' (or the pre-extended first opening 300) can have depth (measured from the front surface 202F), $D_1$, that is substantially greater than the depth (also measured from the front surface 202F), $D_2$, of the second opening 500.

Figure 6:
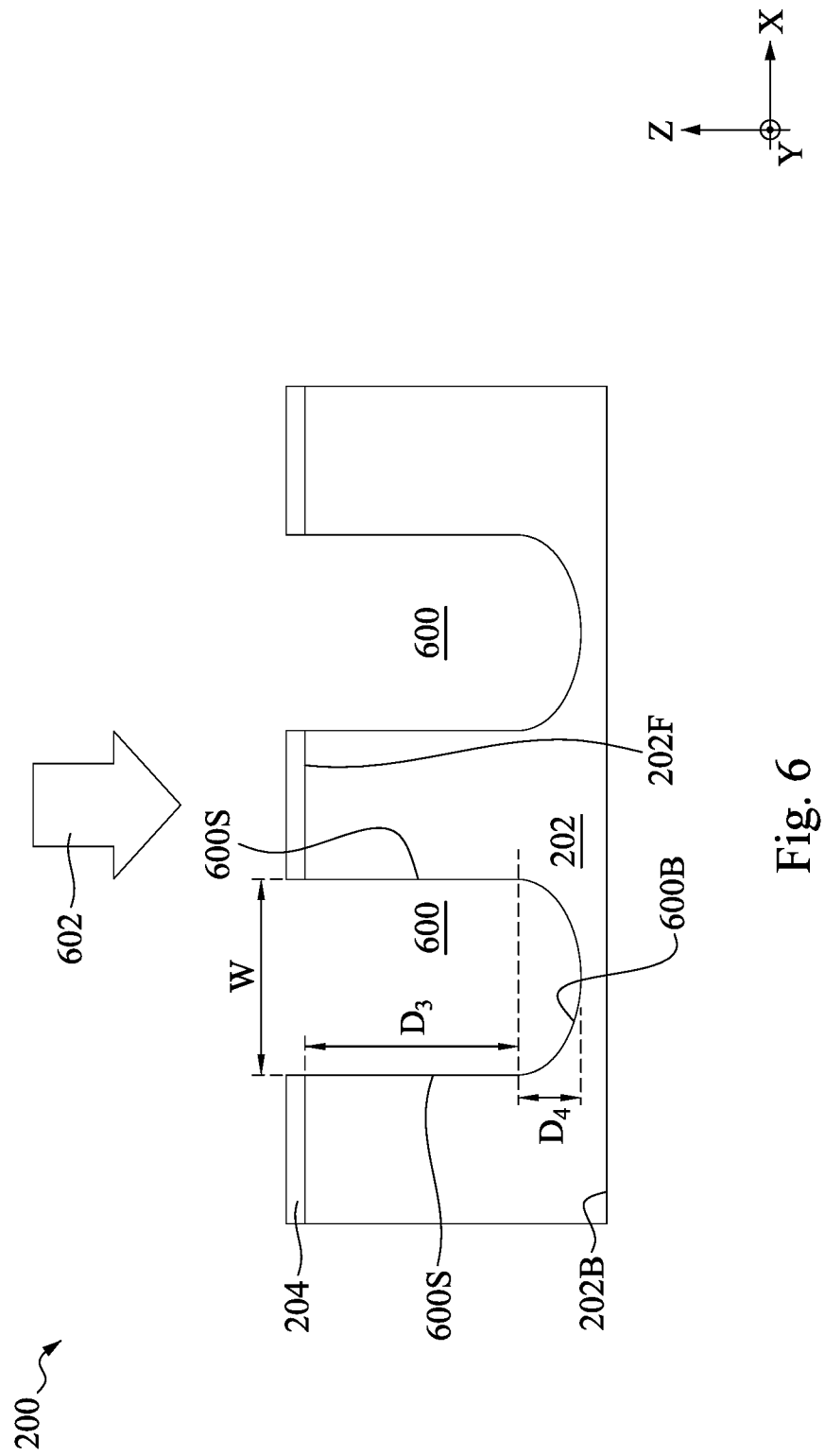

Corresponding to operation 110 of FIG. 1, FIG. 6 is a cross-sectional view of the image sensor device 200 including one or more curve-based openings 600 at one of the various stages of fabrication. In some embodiments, the curve-based openings 600 may be formed by performing an isotropic etching process 602 (indicated by arrow in FIG. 6) on the silicon substrate 202, with the remaining dielectric layer 204 functioning as a mask. The isotropic etching process 602 may include one or more wet etching processes such as, for example, using oxygen-based plasma etchants, using liquid chemicals, or combinations thereof.

Given the isotropic characteristic of the etching process 602, the two openings, 300' and 500 (FIG. 5), that each present a relatively edge-based profile, can be combined to present a hybrid curve-based and edge-based profile, as illustrated in FIG. 6. For example, the opening 600 may include a bottom surface 600B that presents a curve-based (or otherwise a line gradually deviated from being straight) profile and sidewalls 600S that each present an edge-based profile. The curve-based bottom surface 600B can be a portion of a curve selected from the group consisting of: a circle, an ellipse, a parabola, a hyperbola, and combinations thereof. In some embodiments, each of the edge-based sidewalls 600S may be extended into the silicon substrate 202 by depth, $D_3$, and connected to one of the ends of the curve-based bottom surface 600B, which can be further extended into the silicon substrate 202 by depth, $D_4$. In some embodiments, a ratio of the depths $D_3$ to $D_4$ may range between about 1 and about 5, which can limit the curve-based bottom surface 600B located at a relatively lower portion of the opening 600. As such, one or more dislocation defects, if any, can be constrained at the bottom portion of a semiconductor layer formed in the opening 600, which shall be discussed in further detail below. Further, in some embodiments, each of the openings 600 can be formed to have a width (along the X axis), W, that is selected to be approximately equal to the lateral dimension of a non-silicon-based structure that is later formed in the opening 600.

Figure 7:
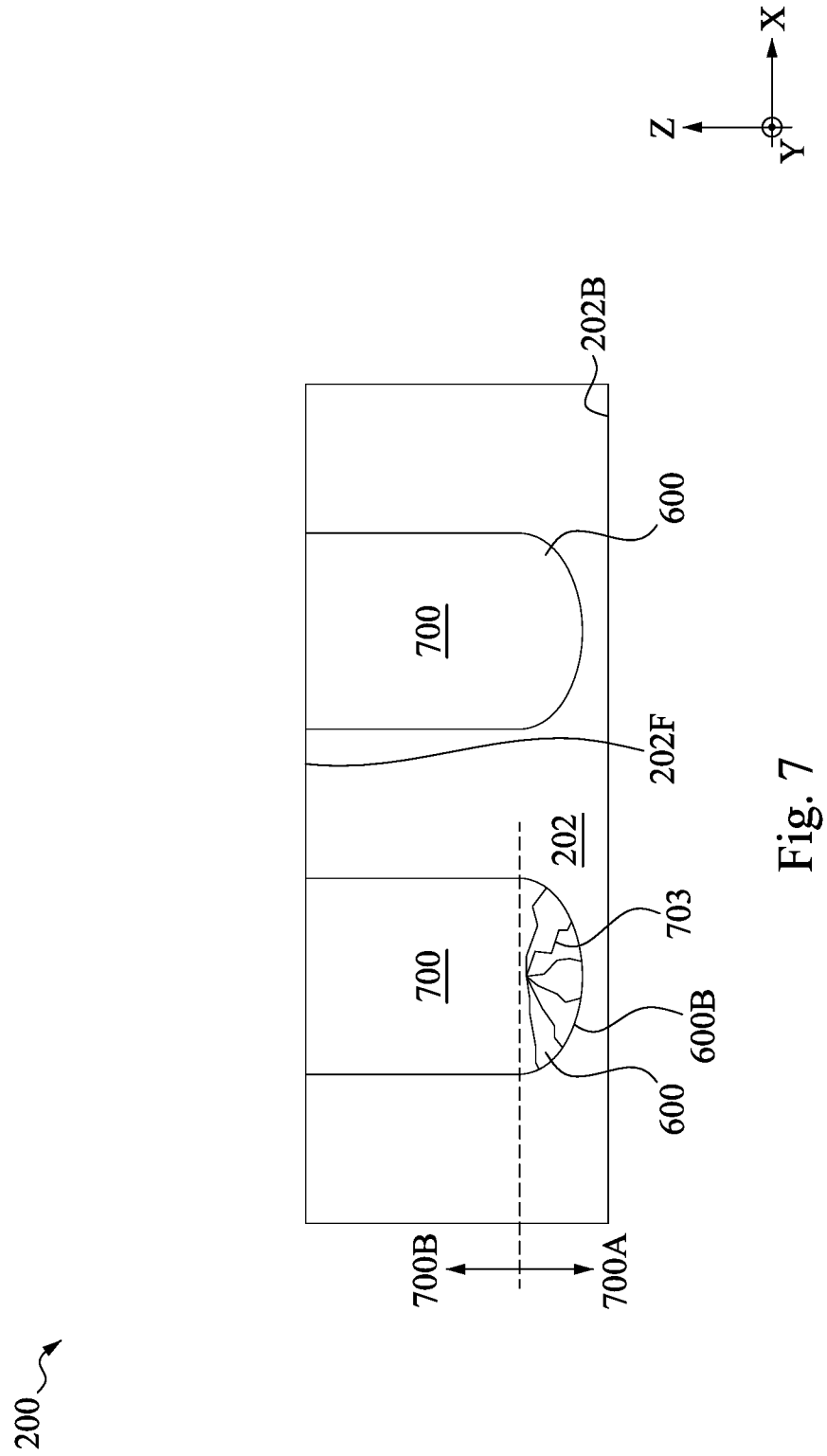

Corresponding to operation 112 of FIG. 1, FIG. 7 is a cross-sectional view of the image sensor device 200 including one or more non-silicon-based structures 700 at one of the various stages of fabrication. In some embodiments, the non-silicon-based structures 700 are formed by growing a number of non-silicon semiconductor materials (or layers) over the silicon substrate 202 using any of a number of suitable epitaxial deposition techniques including, but not limited to, an atmospheric-pressure CVD (APCVD) technique, a low-(or reduced-) pressure CVD (LPCVD) technique, ultra-high-vacuum CVD (UHVCVD) technique, a molecular beam epitaxy (MBE) technique, or an atomic layer deposition (ALD) technique.

Using the CVD technique as a representative example, the non-silicon-based structures 700 can be formed by performing some of the following processes: introducing a source gas (including at least one precursor gas and a carrier gas) into a chamber; elevating a temperature of the chamber, for example, by RF-heating to about 300° C.~900° C.; epitaxially growing a number of non-silicon semiconductor layers to fill the openings 600; optionally, continuing epitaxially growing non-silicon semiconductor layers over the dielectric layer 204 (FIG. 6); and removing the dielectric layer 204 (and excessive non-silicon semiconductor layers over the dielectric layer 204) by performing a planarization process (e.g., a chemical-mechanical polishing (CMP) process).

The non-silicon semiconductor layers may each include a group IV element (other than silicon) or compound, a III-V or III-N compound, or a II-VI compound. Examples of group IV elements include germanium (Ge); examples of group IV compounds include silicon germanium (SiGe); and examples of III-V compounds include aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), indium antimonide (InSb), and their ternary and quaternary compounds. Examples of III-N compounds include aluminum nitride (AlN), gallium nitride (GaN), indium nitride (InN), and their ternary and quaternary compounds. Examples of II-VI compounds includes zinc selenide (ZnSe), zinc telluride (ZnTe), cadmium selenide (CdSe), cadmium telluride (CdTe), zinc sulfide (ZnS), and their ternary and quaternary compounds.

In accordance with various embodiments, given the curve-based bottom surface 600B of the opening 600, when epitaxially growing the non-silicon semiconductor layers to form the non-silicon-based structures 700, threading dislocation defects (symbolically indicated as 703 in FIG. 7) can be constrained at a lower portion 700A of the non-silicon-based structures 700, while preventing the threading dislocation defects from being formed in an upper portion 700B of the non-silicon-based structures 700. This may be because a free edge (for the non-silicon semiconductor layer to grow) is brought closer to another free edge by modifying the bottom surface 600B to have a smaller growth area, when compared to a straight bottom surface. As such, during epitaxially growing the non-silicon semiconductor layers in the opening 600, the threading dislocation defects 703, which are originated from the interface between the non-silicon semiconductor layers and the silicon substrate 202, can be sooner to converge (or otherwise terminate) at the lower portion 700A.

Each of the non-silicon-based structures 700 can be formed to include a non-silicon pixel (hereinafter "non-silicon pixels 700") configured to sense electromagnetic radiation, such as light. By way of example and not limitation, each of the non-silicon pixels 700 includes a photodiode structure, such as a pinned layer photodiode, a photogate, or combinations thereof. Further, the non-silicon pixels 700 may sometimes be referred to as "radiation-detection devices" or "light-sensors." In some embodiments, the non-silicon pixels 700 are formed by doping the silicon substrate 202 from the front surface 202F. For example, the doping process can include doping the semiconductor substrate 202 (e.g., the non-silicon-based structures 700) with a p-type dopant, such as boron, and an n-type dopant, such as phosphorous or arsenic to form a p-n junction. In some embodiments, the non-silicon pixels 700 are formed by a dopant diffusion process and/or an ion implantation process.

The operations of the method 100, as discussed above, can enable non-silicon pixels to be integrated into a standard silicon process. An image sensor device typically includes a number of pixels (e.g., p-n or p-i-n structures) and associated circuitry, such as signal converting circuits. In some applications, it is desired to make the pixels using a low band-gap material, such as Ge, InGaAs, SiGe, and InP for detecting infrared light. In some other examples, pixels made from a high band-gap semiconductor material, such as GaN and InP, are desired for detecting ultra-violet light. Such non-silicon pixels can be formed in the epitaxially grown structures (e.g., 700), which are formed of the non-silicon semiconductor material, such as Ge and InGaAs. Other circuitry of the image sensor device can be formed by using standard silicon processes, such as a standard CMOS process. Further, when the pixel is desired to have a size larger than a critical threshold, such as equal to or larger than about 2 µm, or from about 2 µm to 5 µm, an opening (e.g., 600) in the silicon substrate can be made to have a width equal to or larger than the desired size of the pixel, such as equal to or larger than about 2 µm, or from about 2 µm to about 5 µm. The epitaxially grown structure formed in the opening can thus have a width equal to or larger than the desired size of the pixel. Further, a desired aspect ratio can simultaneously be maintained.

Corresponding to operation 114 of FIG. 1, FIG. 8 is a cross-sectional view of the image sensor device 200 including a device layer 800 formed on the front surface 202F at one of the various stages of fabrication. The device layer 800 includes one or more silicon-based structures 802. Such silicon-based structures 802 can include various functions of field-effect transistors associated with the non-silicon pixels 700 that constitute the image sensor device 200. For example, the silicon-based structure 802 can include a reset transistor, a source follower transistor, a transfer transistor, any other suitable structure, or combinations thereof.

The device layer 800 may also include additional elements or structures, such as doped regions, dummy regions, epitaxial layers, capacitor structures, resistors, etc. These additional elements or structures of the device layer 800 are not shown in FIG. 8 (and the following figures) for simplicity. In some embodiments, the image sensor device 200 includes one or more vertical conductive structures 804 (e.g., vias) that electrically connect the silicon-based structures 802 and other elements of the device layer 800 to upper metallization layers. The conductive structures 804 can form a portion of a middle of the line (MOL) wiring network. In some embodiments, the device layer 800 further includes a nitride layer 806 that is used as an etch stop layer (ESL) in a subsequent etching operation. In some embodiments, the ESL 806 is formed around the silicon-based structures 802, but not between the silicon-based structures 802 and the silicon substrate 202. The ESL 806, silicon-based structures 802, and conductive structures 804 may be embedded or overlaid by a corresponding dielectric layer 808.

Figure 9:
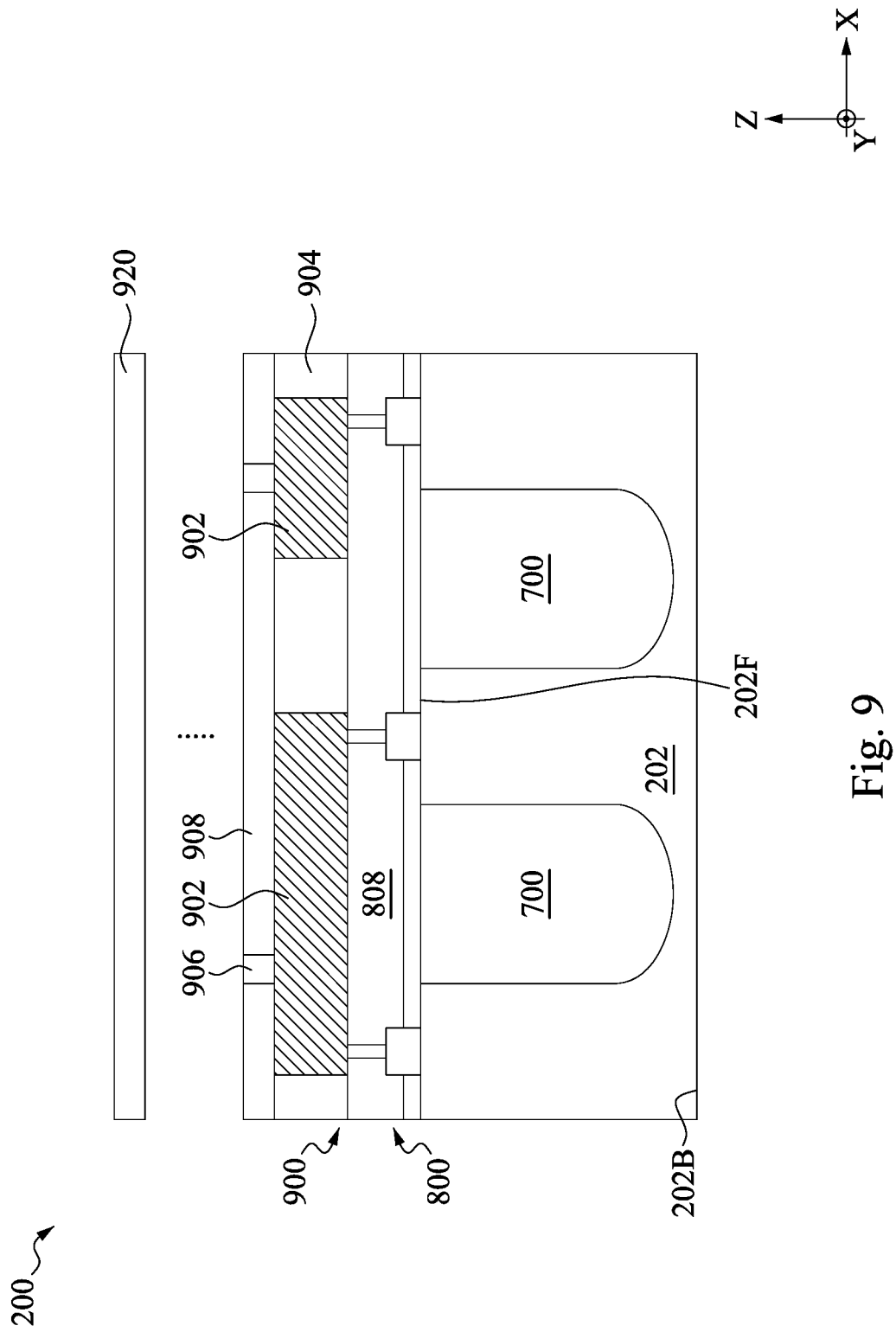

Corresponding to operation 116 of FIG. 1, FIG. 9 is a cross-sectional view of the image sensor device 200 including one or more metallization layers 900 formed on the front surface 202F at one of the various stages of fabrication. Although one metallization layer is shown in the illustrated example of FIG. 9 (and the following figures), it should be understood that the image sensor device 200 can include any desired number of metallization layers while remaining within the scope of the present disclosure. The one or more metallization layers 900 can form a portion of a back end of the line (BEOL) wiring network. Each of the metallization layers (e.g., 900) can include one or more lateral conductive structures 902 (e.g., lines) embedded in a corresponding dielectric layer 904. In some embodiments, one or more conductive structures and a dielectric layer in which the conductive structure(s) are embedded may sometimes be collectively referred to as a metallization layer.

Across different metallization layers, one or more vertical conductive structures 906 (e.g., vias) can be extended through a corresponding dielectric layer 908 to electrically connect adjacent metallization layers along the Z axis. The lines 902 and vias 908, formed of copper, for example, may sometimes be referred to as copper interconnect structures. In some embodiments, each of the copper lines 902 and copper vias 908 may be surrounded by a diffusion barrier layer (not shown). The diffusion barrier layer can include a material selected from a group consisting of: tantalum (Ta), tantalum nitride (TaN), titanium nitride (TiN), titanium tungsten (TiW), and titanium (Ti). In some embodiments, such a barrier layer may sometimes be referred to as a part of the corresponding metallization layer (or the corresponding conductive feature).

The dielectric layers 808, 904, and 908 can electrically isolate the elements and/or structures therein. In some embodiments, each of the dielectric layers 808, 904, and 908 is a portion of an interlayer dielectric (ILD) or inter-metal dielectric (IMD) layer. For example, such an ILD or IMD layer includes silicon oxide, USG, BPSG, a low-k dielectric (e.g., with a dielectric constant lower than 3.9), or a stack of dielectrics—such as a low-k dielectric and another dielectric: (i) a low-k dielectric (e.g., carbon doped silicon oxide) and a silicon carbide with nitrogen doping; (ii) a low-k dielectric (e.g., carbon doped silicon oxide) and a silicon carbide with oxygen doping; (iii) a low-k dielectric (e.g., carbon doped silicon oxide) with silicon nitride; and (iv) a low-k dielectric (e.g., carbon doped silicon oxide) with silicon oxide.

In some other embodiments, the device layer 800 and/or the metallization layers 900 can be formed on a separate semiconductor substrate (e.g., different from the silicon substrate 202) and be subsequently attached to the front surface 202F of the silicon substrate 202.

In certain applications of the image sensor device 200, an application specific integrated circuit (ASIC) and/or a silicon-on-chip (SoC) 920 can be attached to a topmost metallization layer. Such a structure may sometimes be referred to as a three-dimensional (3D) stack, or 3D integrated circuit. The ASIC/SoC 920 can add functionality to the image sensor device 200 or may control functions of the image sensor device 200. In some embodiments, the ASIC/SoC 920 includes metallization layers, semiconductor devices, memory devices, or can be a stack of chips such as memory chips, central processing unit (CPU) chips, other functional chips (e.g., RF chips), or combinations thereof.

In accordance with some embodiments, when the image sensor device 200 functions as a BSI image sensor device, the method 100 may continue with forming additional structures/layers in or on the silicon substrate 202 from the back surface 202B. In this regard, such a partially-fabricated image sensor 200 can be rotated 180° (flipped) around the X axis, as discussed below.

Figure 10:
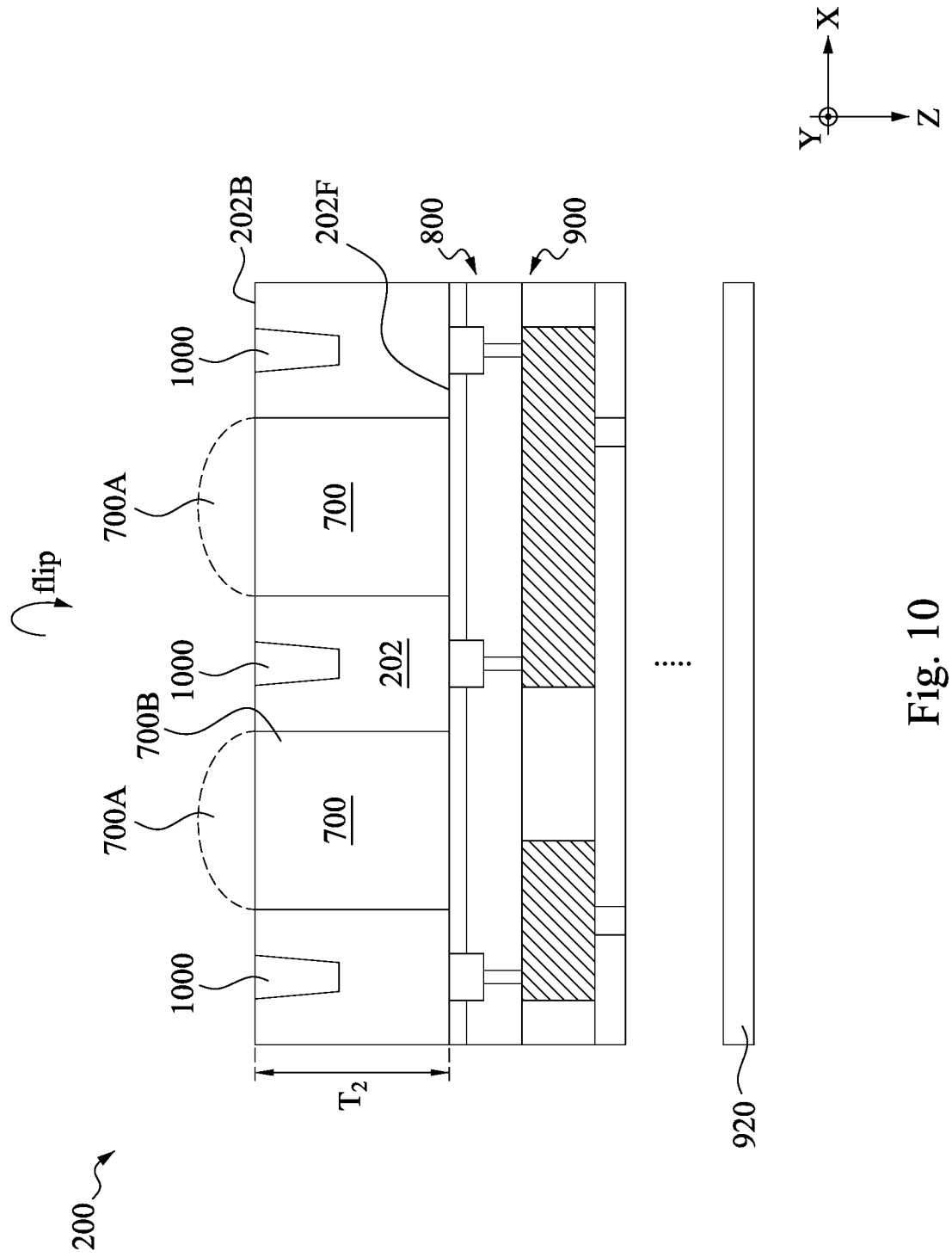

Corresponding to operation 118 of FIG. 1, FIG. 10 is a cross-sectional view of the image sensor device 200, in which the silicon substrate 202 is thinned down from the back surface 202B, at one of the various stages of fabrication. Upon flipping the silicon substrate 202, the silicon substrate 202 may be thinned down to a desired thickness $T_1$.

By way of example and not limitation, thickness $T_1$ can range from about 2 μm to about 6 μm, depending on the application of the image sensor device 200. Thinning the silicon substrate 202 may be performed by a planarization process (e.g., a CMP process), an etch-back process (e.g., a dry etching process), some other thinning process (e.g., grinding), or combinations thereof. Thinning the silicon substrate 202 can also facilitate removal of the respective lower portions 700A of the non-silicon pixels 700 where the threading dislocation defects are constrained. As such, an active region of each of the non-silicon pixels 700 (e.g., where photocurrent is generated) can be constrained in the upper portion 700B where an amount of the threading dislocation defects is minimized, thereby significantly improving the performance of the image sensor device 200.

Further, thinning the silicon substrate 202 can facilitate formation of one or more isolation regions 1000 (e.g., deep trench isolation (DTI) structures), each of which is disposed between adjacent non-silicon pixels 700. The isolation regions 1000 can be formed by etching the silicon substrate 202 to form respective trenches between the non-silicon pixels 700. The trenches are subsequently filled with one or more dielectric materials.

In some other embodiments when the image sensor device 200 functions as a FSI image sensor device, the silicon substrate 202 may not be thinned down from the back surface 202B. As such, even though the lower portions 700A of the non-silicon pixels 700 where the threading dislocation defects are constrained are not removed, the active region of each of the non-silicon pixels 700 can still be constrained in the upper portion 700B where an amount of the threading dislocation defects is minimized. Thus, the performance of the image sensor device 200 can still be significantly improved.

Figure 11:
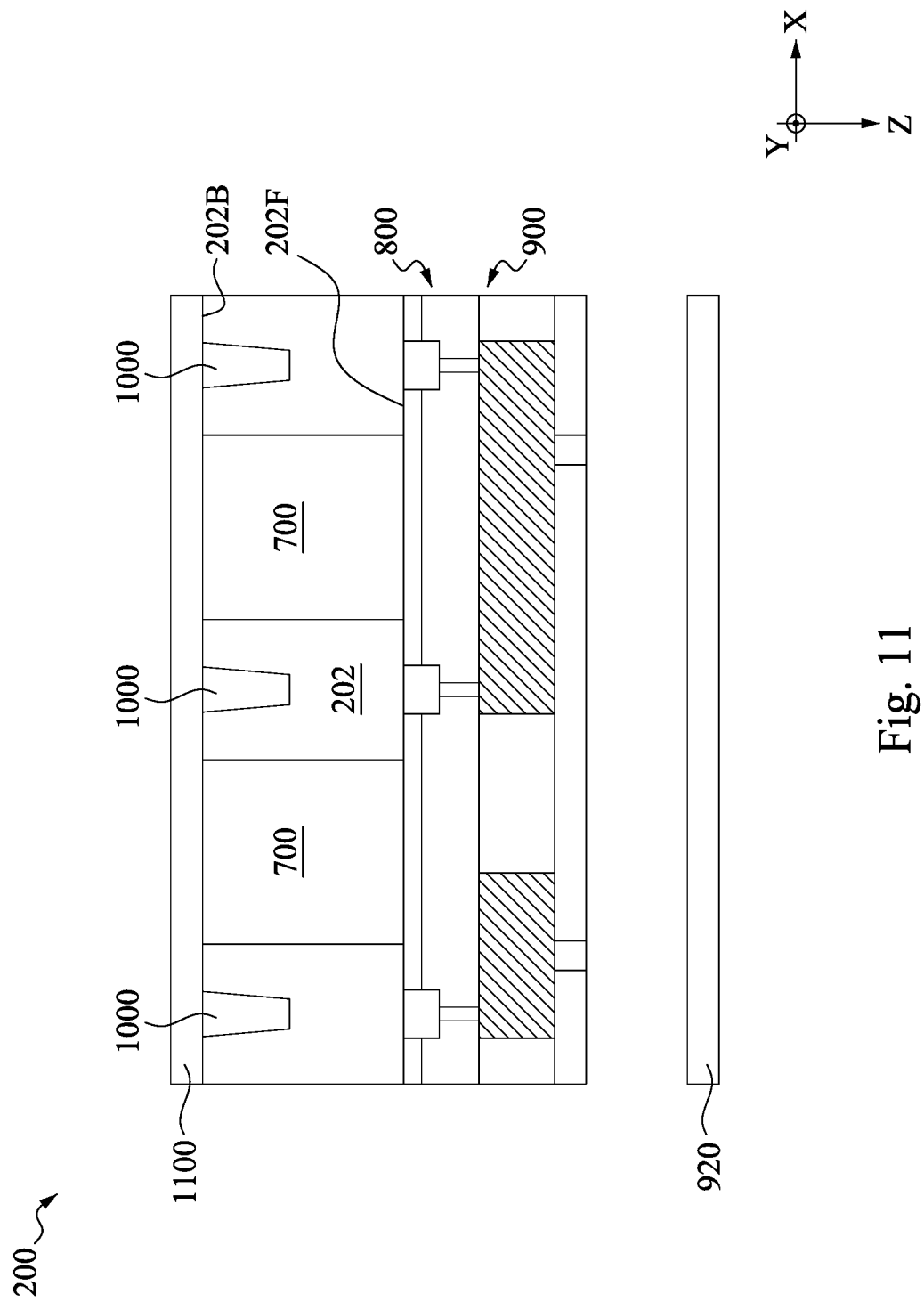

Corresponding to operation 120 of FIG. 1, FIG. 11 is a cross-sectional view of the image sensor device 200 including one or more functional layers 1100 formed on the back surface 202B at one of the various stages of fabrication. The one or more functional layers 1100 can include one or more high-k (with a dielectric constant higher than 3.9) dielectric layers can optionally be formed over the isolation regions 1000. For example, the high-k dielectric layers can each include a material selected from: $Ta_2O_5$, $HfO_2$, $Al_2O_3$, and combinations thereof. Such a high-k dielectric layer can be configured to dissipate undesired charges accumulated in the image sensor device 200. The one or more functional layers 1100 can also include a passivation layer disposed over the high-k dielectric layer(s). The passivation layer can include a dielectric material such as, for example, silicon oxide, silicon nitride, or combinations thereof. In some embodiments, the passivation layer is a protective layer or a hard mask (HM) layer grown or deposited on the back surface 202B.

Alternatively or additionally, when epitaxially growing non-silicon semiconductor materials (or layers) in the opening of a silicon substrate, the threading dislocation defects can be constrained at a lower portion of the non-silicon semiconductor layers by at least one of: overlaying sidewalls of the opening with a doped dielectric layer or modifying a bottom surface of the opening to create a number of protruded patterns, in accordance with various embodiments.

Figure 12:
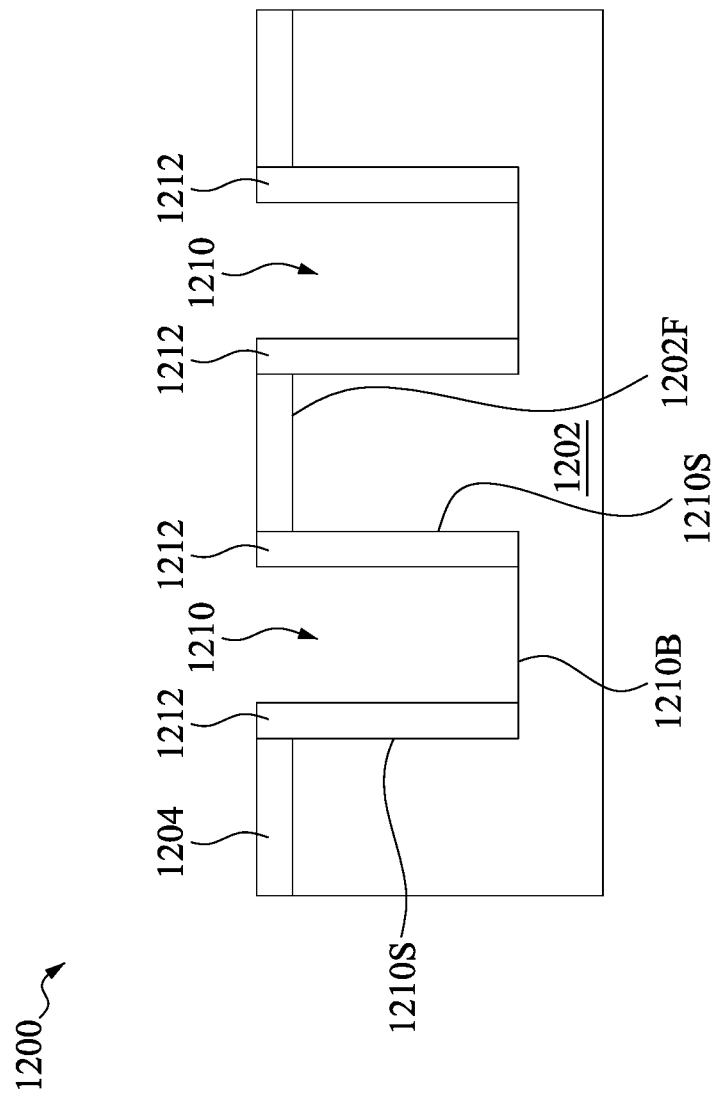
FIG. 12 illustrates a cross-sectional views of another example image sensor device during one of various fabrication stages, made by at least some operations of the method of FIG. 1, in accordance with some embodiments.
Figure 13:
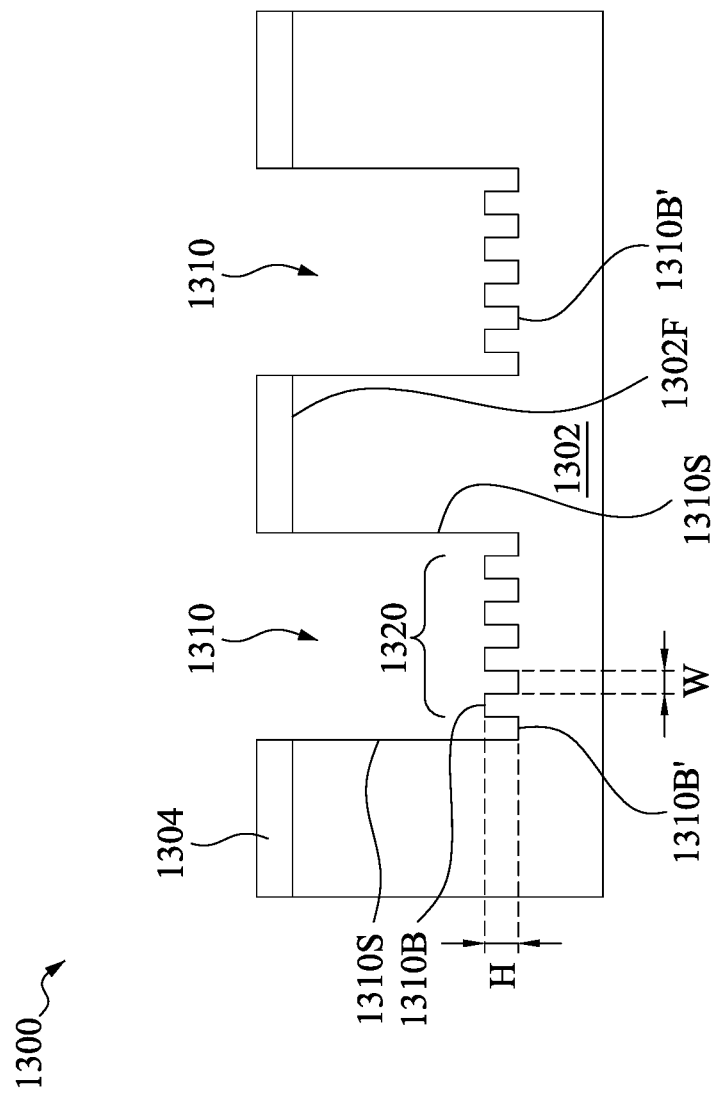
FIG. 13 illustrates a cross-sectional views of yet another example image sensor device during one of various fabrication stages, made by at least some operations of the method of FIG. 1, in accordance with some embodiments.

FIG. 12 illustrates a cross-sectional view of an image sensor device 1200 including one or more openings 1210, each of whose sidewalls are overlaid by a doped dielectric layer 1212, at one of the various stages of fabrication; and FIG. 13 illustrates a cross-sectional view of an image sensor device 1300 including one or more openings 1310, each of whose bottom surface is modified to have a number of protruded patterns 1312, at one of the various stages of fabrication, which shall be discussed in detail below, respectively.

Referring first to FIG. 12, to form the openings 1210 in a silicon substrate 1202, operations 102 and 104 (or operations 106 and 108) of the method 100 (FIG. 1) can be used. Thus, such operations are briefly discussed as follows. For example, a patternable layer having one or more patterns (e.g., openings or windows) is formed on a front surface 1202F of the silicon substrate 1202, with a dielectric layer 1204 disposed therebetween; and at least one anisotropic etching process is performed, through the front surface 1202F, on the dielectric layer 1204 and the silicon substrate 1202 to form the openings 1210.

Subsequently to the openings 1210 being formed, the doped dielectric layer 1212 can be formed to extend along sidewalls 1210S of each of the openings 1210. For example, the doped dielectric layer 1212 can include an oxide (e.g. $SiO_x$), a nitride, (e.g. $TiN_x$), or other suitable materials. In another example, the doped dielectric layer 1212 can include $TiN_x$ or a material having a free-surface energy substantially equal to or higher than that of $TiN_x$. In some embodiments, the doped dielectric layer 1212 can be formed by performing some of the following processes: depositing a blanket doped dielectric layer overlaying at least the openings 1210 (e.g., overlaying the sidewalls 1210S and bottom surfaces 1210B) using in-situ doping techniques; and performing an anisotropic etching process to remove respective portions of the blanket doped dielectric layer on the bottom surfaces 1210B.

The term "in-situ," as used herein, is referred to as depositing the blanket doped dielectric layer and doping the blanket doped dielectric layer in the same chamber. For example, when using a CVD technique (or other suitable deposition techniques) to form a blanket doped dielectric layer, a first precursor gas (e.g., silane ($SiH_4$)) and a second precursor gas (e.g., diborane ($B_2H_6$)) may be concurrently flown into the same CVD chamber at an elevated temperature to form a $SiO_x$ blanket layer doped with p-type impurities. It should be noted that the blanket dielectric layer may be doped with another type of impurities (e.g., n-type impurities) while remaining within the scope of the present disclosure. As such, phosphine ($PH_3$) may be used as the second precursor gas.

In accordance with various embodiments, upon the doped dielectric layer 1212 being formed to extend the sidewalls 1210S, operations 112, 114, 116, 118, and 120 of the method 100 (FIG. 1) may be used to continue fabricating the image sensor device 1200. The doped dielectric layer 1212 can heal the sidewalls 1210S that may be damaged during the formation of the openings 1210. By blocking such damaged sidewalls 1210S, which may in turn result in forming threading dislocation defects in the epitaxially grown non-silicon semiconductor layers in the openings 1210 (e.g., operation 112), the threading dislocation defects can be constrained at a lower portion of the epitaxially grown non-silicon semiconductor layers. Further, the threading dislocation defects can be terminated at the doped dielectric layer 1212, which may significantly reduce an amount of the threading dislocation defects. The doped dielectric layer 1212 can also help isolation between adjacent pixels (where the epitaxially grown non-silicon semiconductor layers are formed), thereby improving performance of the image sensor device 1200 as a whole, e.g., reducing dark current.

Referring to FIG. 13, to form the openings 1310 in a silicon substrate 1302, operations 102 and 104 (or operations 106 and 108) of the method 100 (FIG. 1) can be used. Thus, such operations are briefly discussed as follows. For example, a patternable layer having one or more patterns (e.g., openings or windows) is formed on a front surface 1302F of the silicon substrate 1302, with a dielectric layer 1304 disposed therebetween; and at least one anisotropic etching process is performed, through the front surface 1302F, on the dielectric layer 1304 and the silicon substrate 1302 to form the openings 1310.

Subsequently to the openings 1310 being formed, a patterning process may be performed on a bottom surface 1310B of each of the openings 1310 to form a number of protruded patterns 1320 therein. For example, a patternable layer, having a number of openings, may be deposited in the opening 1310; and at least one anisotropic etching process is performed on the silicon substrate 1302 in the opening 1310 (i.e., the bottom surface 1310B). As such, portions of the bottom surface 1310B that are exposed by the openings of the patternable layer are removed by the anisotropic etching process, thus causing respective surfaces, 1310B', of such etched portions to further extend into the silicon substrate 1302. A vertical distance between the surfaces 1310B and 1310B' may be defined as a height, H, of each of the protruded patterns 1320. The height H may be controlled by one or more operation conditions of the anisotropic etching process such as, for example, how long the process lasts, how much energy is applied, etc. A lateral distance, W, between adjacent ones of the protruded patterns 1320 may be defined according to the patternable layer.

In some embodiments, a ratio of the vertical distance (H) to the lateral distance (W) of each of the protruded patterns 1320 may be greater than 1 to constraint threading dislocation defects. In some alternative or additional embodiments, the protruded patterns 1320 may have the same shape or respective different shapes. For example, each of the protruded patterns 1320 may have a rectangular shape (as shown in FIG. 13) or a trapezoidal shape. When configured in the rectangular shape, each of the protruded patterns 1320 may have approximately equal upper and lower edges, with approximately vertical side edges connecting the upper and lower edges; and when configured in the trapezoidal shape, each of the protruded patterns 1320 may have approximately unequal upper and lower edges, with tilted side edges connecting the upper and lower edges. In another example, some of the protruded patterns 1320 may have a rectangular shape and some of the protruded patterns 1320 may have a trapezoidal shape. Upon the protruded patterns 1320 being formed, operations 112, 114, 116, 118, and 120 of the method 100 (FIG. 1) may be used to continue fabricating the image sensor device 1300. Given the protruded patterns 1320 formed around the bottom surface 1310B/1310B', the threading dislocation defects can be constrained at a lower portion of the epitaxially grown non-silicon semiconductor layers (in response to operation 112). Further, the threading dislocation defects can be terminated at sidewalls of the protruded patterns 1320, which may significantly reduce an amount of the threading dislocation defects.

In some embodiments, the protruded patterns 1320 may have multiple heights, H. For example, some of the protruded patterns 1320 may share a first height, and some of the protruded patterns 1320 may share a second height, wherein the first height is different from the second height. To achieve such protruded patterns 1320 with multiple heights, multiple patternable layers may be used. For example, a first patternable layer may be formed in the opening 1310 to etch the substrate 1302. As such, a first set of protruded patterns, with a first height, may be formed. Next, a second patternable layer may be formed in the opening 1310 to cover some of the first set of protruded patterns such that the others of the first set of protruded patterns that are not covered by the second patternable layer can be further etched. Accordingly, such "uncovered" protruded patterns can have a second height that is greater than the first height.

Although not shown, in some other embodiments, a doped or an intrinsic dielectric layer (e.g., similar to 1212) can be formed to extend along sidewalls of each of the openings 1310. For example, such a dielectric layer can include an oxide (e.g. $SiO_x$), a nitride, (e.g. $TiN_x$), or other suitable materials. In another example, the dielectric layer can include $TiN_x$ or a material having a free-surface energy substantially equal to or higher than that of $TiN_x$. In some embodiments, the dielectric layer, if doped, can be formed by performing some of the following processes prior to or subsequently to forming the protruded patterns 1320: depositing a blanket doped dielectric layer overlaying at least the openings 1310 using in-situ doping techniques; and performing an anisotropic etching process to remove respective portions of the blanket doped dielectric layer on the bottom surfaces 1310B.

In one aspect of the present disclosure, a method is disclosed. The method includes forming a plurality of openings extending into a substrate from a front surface of the substrate. The substrate includes a first semiconductor material. Each of the plurality of openings has a curve-based bottom surface. The method includes filling the plurality of openings with a second semiconductor material. The second semiconductor material is different from the first semiconductor material. The method includes forming a plurality of pixels that are configured to sense light in the plurality of openings, respectively, using the second semiconductor material.

In another aspect of the present disclosure, a method is disclosed. The method includes forming an opening extending into a silicon substrate from its front surface. The opening has edge-based sidewalls and a curve-based bottom surface. The method includes filling the opening with a non-silicon semiconductor material. The method includes forming a pixel in the opening. The pixel is configured to sense light through a back surface of the silicon substrate.

In yet another aspect of the present disclosure, a method is disclosed. The method includes etching a substrate from its front surface to form a first sub-opening, the substrate including a first semiconductor material. The method includes etching the substrate form the front surface to form a second sub-opening aligned with the first sub-opening, the first sub-opening being deeper but narrower than the second sub-opening. The method includes extending the first sub-opening and the second sub-opening into the substrate to form an opening having a curve-based bottom surface. The method includes epitaxially growing a second semiconductor material in the opening, the second semiconductor material being different from the first semiconductor material. The method includes forming a p-n junction using the second semiconductor material filled in the opening. The pixel is configured to sense light through a back surface of the substrate. The back surface is opposite to the front surface The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a plurality of openings extending into a substrate from a front surface of the substrate, the substrate including a silicon-based semiconductor material;
forming a plurality of protruded patterns along a bottom surface of each of the plurality of openings;
filling the plurality of openings with a non-silicon-based semiconductor material; and
forming a plurality of light-sensing pixels using the non-silicon-based semiconductor material.

2. The method of claim 1, wherein the non-silicon-based semiconductor material includes at least one material selected from the group consisting of germanium, gallium phosphide, indium phosphide, aluminum arsenide, gallium arsenide, indium arsenide, aluminum antimonide, gallium antimonide, and indium antimonide.

3. The method of claim 1, wherein the step of forming the plurality of protruded patterns further comprises performing at least one anisotropic etching process.

4. The method of claim 1, wherein each of the plurality of protruded patterns has a height and neighboring ones of the plurality of protruded patterns are laterally separated by a distance.

5. The method of claim 4, wherein a ratio of the height to the distance is greater than 1.

6. The method of claim 1, wherein each of the plurality of protruded patterns has a rectangular shape or a trapezoidal shape.

7. The method of claim 1, further comprising forming a dielectric layer extending along sidewalls of each of the plurality of openings.

8. The method of claim 7, wherein the dielectric layer includes at least one of doped silicon oxide or doped titanium nitride.

9. A method, comprising:
forming a recess that extends from a front surface of in a substrate, the substrate including a silicon-based semiconductor material;
forming protrusions along a bottom surface of the recess;
forming a non-silicon-based semiconductor material over the protrusions to fill the recess; and
forming a light-sensing pixel based on the non-silicon-based semiconductor material.

10. The method of claim 9, wherein a ratio of a height of each protrusion to a lateral distance between two adjacent protrusions is greater than 1.

11. The method of claim 9, wherein each protrusion has a rectangular shape or a trapezoidal shape.

12. The method of claim 9, wherein the non-silicon-based semiconductor material includes at least one material selected from the group consisting of germanium, gallium phosphide, indium phosphide, aluminum arsenide, gallium arsenide, indium arsenide, aluminum antimonide, gallium antimonide, and indium antimonide.

13. The method of claim 9, further comprising forming a dielectric layer extending along each sidewall of the recess.

14. The method of claim 13, wherein the dielectric layer is a doped dielectric layer, and wherein the step of forming the dielectric layer comprises:

depositing the doped dielectric layer as a blanket layer using an in-situ doping technique; and performing an anisotropic etching process to remove portions of the doped dielectric layer deposited along the bottom surface of the recess.

15. A method, comprising:

forming an opening extending from a front surface of a substrate;

patterning a bottom surface of the opening to form protrusions;

filling the opening with a non-silicon-based semiconductor material;

forming a pixel using the non-silicon-based semiconductor material; and forming a device layer including a silicon-based structure over the pixel.

16. The method of claim 15, further comprising:

forming metallization layers over the device layer; and thinning the substrate from a back surface opposite the front surface.

17. The method of claim 15, further comprising forming a doped dielectric layer extending along each sidewall of the opening before the step of filling the opening with the non-silicon-based semiconductor material.

18. The method of claim 15, wherein the substrate includes a silicon-based semiconductor material, and wherein the non-silicon-based semiconductor material includes at least one material selected from the group consisting of germanium, gallium phosphide, indium phosphide, aluminum arsenide, gallium arsenide, indium arsenide, aluminum antimonide, gallium antimonide, and indium antimonide.

* * * * *